US009312150B2

(12) United States Patent
Ahmad et al.

(10) Patent No.: US 9,312,150 B2
(45) Date of Patent: *Apr. 12, 2016

(54) SEMICONDUCTOR DEVICE AND METHOD OF FORMING A METALLURGICAL INTERCONNECTION BETWEEN A CHIP AND A SUBSTRATE IN A FLIP CHIP PACKAGE

(75) Inventors: Nazir Ahmad, San Jose, CA (US);
Young-Do Kweon, Cupertino, CA (US);
Samuel Tam, Daly City, CA (US);
Kyung-Moon Kim, Kyoung ki-do (KR);
Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 325 days.

This patent is subject to a terminal disclaimer.

(21) Appl. No.: 13/268,048

(22) Filed: Oct. 7, 2011

(65) Prior Publication Data
US 2012/0049357 A1     Mar. 1, 2012
US 2013/0113093 A9     May 9, 2013

Related U.S. Application Data

(63) Continuation of application No. 12/472,083, filed on May 26, 2009, now Pat. No. 8,119,450, which is a continuation of application No. 11/444,894, filed on Jun. 1, 2006, now abandoned, which is a continuation (Continued)

(51) Int. Cl.
*H01L 21/56*     (2006.01)
*H01L 23/00*     (2006.01)

(52) U.S. Cl.
CPC .............. *H01L 21/563* (2013.01); *H01L 24/29* (2013.01); *H01L 24/81* (2013.01);

(Continued)

(58) Field of Classification Search
CPC .................. H01L 21/563; H01L 24/81; H01L 2924/07802; H01L 2224/29144; H01L 2224/2919; H01L 2224/29111; H01L 292/0132; H01L 2924/014; H01L 2224/13144; H01L 2224/81801; H01L 2924/0105; H01L 2924/01079; H01L 2224/16145; H01L 2224/73203; H01L 2224/81203
USPC ......................................... 438/105, 615, 661
See application file for complete search history.

(56) References Cited

U.S. PATENT DOCUMENTS 4,208,005 A     6/1980    Nate et al.
4,875,617 A    10/1989    Citowsky (Continued)

FOREIGN PATENT DOCUMENTS

EP       0461378 A2    12/1991
JP       54105774        8/1979

(Continued)

*Primary Examiner* — Kevin Parendo
(74) *Attorney, Agent, or Firm* — Robert D. Atkins; Patent Law Group: Atkins and Associates, P.C.

(57) ABSTRACT

A method for forming metallurgical interconnections and polymer adhesion of a flip chip to a substrate includes providing a chip having a set of bumps formed on a bump side thereof and a substrate having a set of interconnect points on a metallization thereon, providing a measured quantity of a polymer adhesive in a middle region of the chip on the bump side, aligning the chip with the substrate so that the set of bumps aligns with the set of interconnect points, pressing the chip and the substrate toward one another so that a portion of the polymer adhesive contacts the substrate and the bumps contact the interconnect points, and heating the bumps to a temperature sufficiently high to form a metallurgical connection between the bumps and the interconnect points.

15 Claims, 1 Drawing Sheet

Related U.S. Application Data of application No. 09/802,375, filed on Mar. 9, 2001, now abandoned.

(60) Provisional application No. 60/188,568, filed on Mar. 10, 2000.

(52) U.S. Cl.
CPC ............... *H01L 2224/1134* (2013.01); *H01L 2224/13144* (2013.01); *H01L 2224/13147* (2013.01); *H01L 2224/16145* (2013.01); *H01L 2224/16225* (2013.01); *H01L 2224/2919* (2013.01); *H01L 2224/29111* (2013.01); *H01L 2224/29144* (2013.01); *H01L 2224/73203* (2013.01); *H01L 2224/81203* (2013.01); *H01L 2224/81801* (2013.01); *H01L 2224/83102* (2013.01); *H01L 2224/83191* (2013.01); *H01L 2224/83194* (2013.01); *H01L 2224/92125* (2013.01); *H01L 2924/014* (2013.01); *H01L 2924/0105* (2013.01); *H01L 2924/01006* (2013.01); *H01L 2924/01029* (2013.01); *H01L 2924/0132* (2013.01); *H01L 2924/01033* (2013.01); *H01L 2924/01058* (2013.01); *H01L 2924/01076* (2013.01); *H01L 2924/01079* (2013.01); *H01L 2924/01082* (2013.01); *H01L 2924/07802* (2013.01); *H01L 2924/181* (2013.01)

(56) References Cited

U.S. PATENT DOCUMENTS

| | | |
|---|---|---|
| 5,210,938 A | 5/1993 | Hirai |
| 5,250,469 A | 10/1993 | Tanaka et al. |
| 5,346,857 A | 9/1994 | Scharr et al. |
| 5,386,624 A | 2/1995 | George et al. |
| 5,421,507 A | 6/1995 | Davis et al. |
| 5,428,996 A | 7/1995 | Abbink et al. |
| 5,508,561 A | 4/1996 | Tago et al. |
| 5,620,560 A | 4/1997 | Akimoto et al. |
| 5,713,508 A | 2/1998 | Gaynes et al. |
| 5,717,477 A | 2/1998 | Fritz et al. |
| 5,801,350 A | 9/1998 | Shibuya et al. |
| 5,829,126 A | 11/1998 | Nagao et al. |
| 5,863,815 A | 1/1999 | Egawa |
| 5,865,365 A | 2/1999 | Nishikawa et al. |
| 5,869,904 A | 2/1999 | Shoji |
| 5,874,780 A | 2/1999 | Murakami |
| 5,892,289 A | 4/1999 | Tokuno |
| 5,931,371 A | 8/1999 | Pao et al. |
| 5,953,814 A | 9/1999 | Sozansky et al. |
| 5,959,362 A | 9/1999 | Yishino |
| 5,977,633 A | 11/1999 | Suzuki et al. |
| 6,037,192 A | 3/2000 | Witzman et al. |
| 6,100,597 A | 8/2000 | Nakamura |
| 6,121,069 A * | 9/2000 | Boyko et al. .................. 438/106 |
| 6,130,476 A | 10/2000 | LaFontaine, Jr. et al. |
| 6,153,940 A | 11/2000 | Zakel et al. |
| 6,162,660 A | 12/2000 | LaFontaine, Jr. et al. |
| 6,173,887 B1 | 1/2001 | Mead et al. |
| 6,214,642 B1 | 4/2001 | Chen et al. |
| 6,225,144 B1 | 5/2001 | How et al. |
| 6,251,705 B1 * | 6/2001 | Degani et al. ................. 438/108 |
| 6,330,967 B1 | 12/2001 | Milewski et al. |
| 6,337,522 B1 | 1/2002 | Kang et al. |
| 6,365,438 B1 | 4/2002 | Ishida et al. |
| 2001/0045637 A1 | 11/2001 | Farquhar et al. |

FOREIGN PATENT DOCUMENTS

| | | |
|---|---|---|
| JP | 05041404 | 2/1993 |
| JP | 08-031870 | 2/1996 |
| JP | 09-213702 | 8/1997 |
| JP | 09-246423 | 9/1997 |
| JP | 10-242208 | 9/1998 |
| JP | 11-274241 | 10/1999 |
| JP | 11-307585 | 11/1999 |
| JP | 2001-015641 | 1/2001 |
| JP | 2001-035882 | 2/2001 |
| WO | 99/04430 | 1/1999 |

\* cited by examiner

SEMICONDUCTOR DEVICE AND METHOD OF FORMING A METALLURGICAL INTERCONNECTION BETWEEN A CHIP AND A SUBSTRATE IN A FLIP CHIP PACKAGE

CLAIM TO DOMESTIC PRIORITY

The present application is a continuation of U.S. application Ser. No. 12/472,083, filed May 26, 2009, now U.S. Pat. No. 8,119,450, which is a continuation of U.S. patent application Ser. No. 11/444,894, filed Jun. 1, 2006, which is a continuation of U.S. patent application Ser. No. 09/802,375, filed Mar. 9, 2001, which claims benefit of Provisional Application No. 60/188,568, filed Mar. 10, 2000.

FIELD OF THE INVENTION

This invention relates to flip chip packaging and, more particularly, to providing a metallurgical interconnection between a chip and a substrate in a flip chip package.

BACKGROUND OF THE INVENTION

Conventional methods for interconnecting a flip chip to a substrate include an Anisotropic Conductive Film (ACF) with Ni or Ni/Au coated polymer particles in which a contact type interconnection is made. Fragments of the polymer film which remain trapped at the interconnection point often lead to poor electrical contact and reduced reliability of the package. Additionally, the polymer film reduces the reliability of the bonding interface during the chip bonding process. Conventional flip chip techniques that use either ACF, Non-Conductive Adhesive (NCA) or Non Conductive Polymer (NCP) also suffer from problems in curing the adhesive on adjacent bonding sites on a substrate during the chip bonding process.

SUMMARY OF THE INVENTION

What is needed is a flip chip structure and method that provides for metallurgical interconnection between the flip chip and the substrate and that further provides for improved bonding between the chip and the substrate. Accordingly, in one embodiment, the present invention is a method of making a semiconductor device comprising providing a substrate, and forming a conductive layer on the substrate. The conductive layer includes a first metal. A semiconductor die is provided. A bump is formed on the semiconductor die. The bump includes a second metal. The semiconductor die is positioned proximate to the substrate to contact the bump to the conductive layer and form a bonding interface. The bonding interface is heated to a melting point of the first metal for a time sufficient to melt a portion of the first metal from the conductive layer. The bump and the conductive layer are metallurgically reacted at the melting point of the first metal to dissolve a portion of the bump. A bonding phase is formed at the bonding interface by mixing a dissolved portion of the bump with a molten portion of the first metal.

In another embodiment, the present invention is a method of making a semiconductor device comprising providing a substrate and forming a conductive layer on the substrate. The conductive layer includes a first metal. A semiconductor die is provided. A bump is formed on the semiconductor die. The bump includes a second metal. The semiconductor die is positioned proximate to the substrate to contact the bump to the conductive layer and form a bonding interface. The bump and the conductive layer are metallurgically reacted at a melting point of the first metal to dissolve a portion of the bump. A bonding phase is formed at the bonding interface by mixing a dissolved portion of the bump with a molten portion of the first metal.

In another embodiment, the present invention is a method of making a semiconductor device comprising providing a substrate, and forming a conductive layer on the substrate. A semiconductor die is provided. A bump is formed on the semiconductor die. The semiconductor die is positioned proximate to the substrate to contact the bump to the conductive layer and form a bonding interface. The bump and the conductive layer are metallurgically reacted to dissolve a portion of the bump. A bonding phase is formed at the bonding interface by mixing a dissolved portion of the bump with a molten portion of the conductive layer.

In another embodiment, the present invention is a semiconductor device comprising a substrate and a conductive layer disposed on the substrate. The conductive layer includes a first metal. A bump is disposed on the conductive layer. The bump includes a second metal. A bonding phase is disposed between the conductive layer and the bump. The bonding phase includes a metal alloy of the first metal and the second metal. A semiconductor die is attached to the bump.

DETAILED DESCRIPTION OF THE DRAWINGS

In one general aspect the invention features a method for providing metallurgic connection between a flip chip and a substrate, by providing a chip having a set of bumps formed on a bump side thereof, providing a substrate having a set of interconnect points on a metallization thereon, providing a measured quantity of a polymer adhesive in a middle region of the chip on the bump side, aligning the chip with the substrate so that the set of bumps aligns with the set of interconnect points, pressing the chip and the substrate toward one another so that a portion of the polymer adhesive contacts the substrate and the bumps contact the interconnect points, and heating the bumps to a temperature sufficiently high to form a metallurgical connection between the bumps and the interconnect points.

In some embodiments the bumps are stud bumps, and are formed of gold; and the interconnect points include spots of tin, preferably pure tin, on the metallization. In other embodiments the bumps are formed of a metal such as, for example, copper plated with Au or with Ni/Au or electroless Ni/Au; and the interconnect points also may include such materials. In embodiments in which the stud bumps are made of Au and the interconnect points are spots of Sn, the heating step raises the temperature of the bumps sufficiently to create an alloy between the Au and the Sn in a bonding phase at the interface; in preferred embodiments the bonding phase comprises a 80:20 Au:Sn alloy. For such an alloy the bumps may be sufficiently heated by heating the die to a temperature greater than about 200° C., preferably about 232° C.

In some embodiments the method further includes underfilling with a polymer.

In another general aspect the invention features a chip package structure made according to the method.

In another general aspect the invention features a chip package structure including a chip having a bumps formed thereon and a substrate having interconnect points on a metallization thereon, the bumps forming contacts with the interconnect points, in which an alloy is formed at an interface between the material of each bump and the material of the interconnect in contact with the bump.

In some embodiments a cured adhesive polymer is situated in a middle region between the bump surface of the chip and the surface of the substrate.

In some embodiments the bump material is gold or is a metal such as copper plated with gold or with Ni/Au or with electroless Ni/Au; and the interconnect points also include such materials. In some embodiments the alloy at the interface is an alloy of Au and Sn, and preferably the alloy is a 20:80 Sn:Au alloy.

A description of an exemplary embodiment of the invention follows. Using the disclosure herein, substantially conventional apparatus can be modified for use in the process of the invention.

Figure 1A:
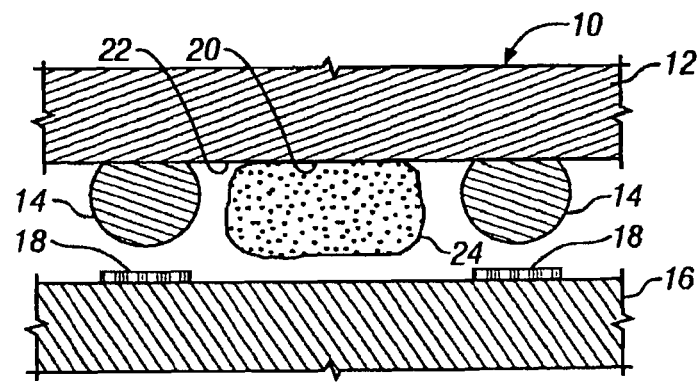
FIGS. 1A and 1B are diagrammatic sketches in a sectional view showing an illustrative embodiment of stages according to the invention for making a packaging structure according to the invention.
Figure 1B:
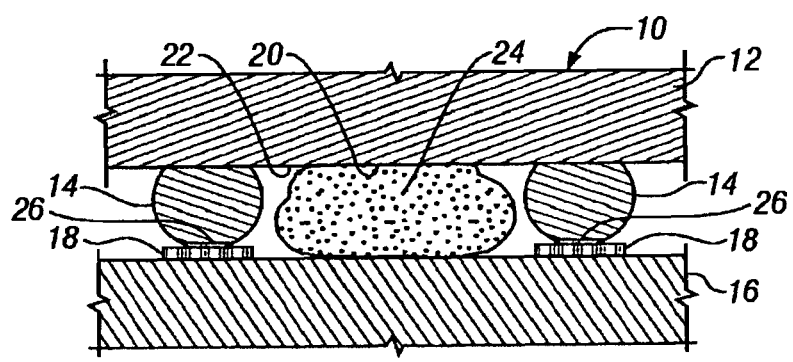

With reference to the Figs., there are shown in FIG. 1A a chip and a substrate in alignment prior to forming the interconnect according to the invention, and in FIG. 1B a completed interconnect. The flip chip configuration, shown generally at 10, includes a plurality of bumps, e.g. 14, formed on the chip 12, the bumps preferably being gold (Au) stud bumps. The corresponding interconnection points, on a standard substrate 16 metallization are provided with a plurality of preferably pure tin (Sn) spots 18. A central area 20 of the chip on a bump side 22 further includes a spot of adhesive 24 small enough that it does not spread to the gold studs and the interconnection area during a subsequent bonding process. As the chip is connected to the substrate in the flip chip format, the adhesive holds the chip to the substrate and the ends of the stud bumps 14 react with the pure tin spots 18 on the substrate to make metallurgical interconnections 26.

A substrate strip populated with a row or an array of chips assembled in this manner can be molded using simple tooling, readily adapted from conventional equipment. The molding preferably provides die underfilling and molding compound along the perimeters of the die simultaneously. Solder balls can then be attached and the completed chips can be singularized by, for example, sawing the substrate.

The flip chip is aligned with the substrate in such a manner that the gold stud bumps on the chip align with the tin spots on the substrate. After alignment and contact between the Sn spots and the Au stud bumps, the die is heated to a temperature and for a time sufficient to give a metallurgical reaction at the interface between the bumps and the spots, preferably in excess of about 200° C. For an Au—Sn junction, a suitable temperature is about 232° C., and a suitable time is 1-2 seconds. At this temperature, the Sn spots melt and the temperature at the bonding interface increases significantly, thereby dissolving some Au from both a metallization layer on the substrate and the stud bumps to create a bonding phase at the interface between the Sn spots and the Au stud bumps. Preferably a 80%:20% Au:Sn alloy composition is formed at the interface. Such an alloy provides both reliable electrical contact and advantageous mechanical properties.

As the Sn/Au interconnection is made the adhesive spot cures to hold the die in place. A subsequent underfilling process of the structure is thereby facilitated as the center region of the chip is already filled with the adhesive polymer. Overmolding fills the remaining space under the die and the space between the chips, resulting in a robust structure.

An alternative embodiment provides for direct contact between the gold stud bumps and a standard metallization on the substrate. A metallization bondable to withstand the stresses of subsequent processing is thereby formed as there is no interposing polymer at the bonding interface during the chip bonding process.

To achieve wafer scale packaging, a wafer having stud bumps thereon is placed face up on a heating stage. Substrate pieces, inspected and singulated, with appropriate amounts of adhesive are then picked, aligned, placed and bonded to wafer sites applying conventional process conditions of temperature and pressure. Ultrasonic scrubbing may be employed to clean the substrate site before thermal compression bonding. The disclosed process provides for little waste of substrate material as only particular rejected sites will be discarded, rather than the entire substrate strip. Additionally, it is not necessary to bond to the rejected dies on the wafer. After fully populating the wafer, the wafer is molded for underfilling and interchip space filling. Dicing the wafer then follows the molding and solder ball mounting steps to singulate the dies.

In alternative embodiments the stud bumps include Cu plated with Ni and Au, plated Au or electroless Ni/Au, and these materials may be also provided on the bonding sites of the substrate. With the advances in Cu terminal metallurgy, the bonding sites may be finished with Ni and heavy soft Au, thereby providing for interconnections between the wafer and substrate I/Os either by thermal compression bonding utilizing Au or by fusion at low temperatures utilizing Sn like metals to form suitable bonding phases. Once metallurgical contacts are formed, the structure is underfilled and transfer molded simultaneously.

Other embodiments are within the following claims.

What is claimed is:

1. A method of making a semiconductor device, comprising:
   providing a substrate singulated from a substrate panel;
   forming a conductive layer including a first metal on the substrate;
   providing a semiconductor wafer including a semiconductor die;
   forming a bump including a second metal on the semiconductor die;
   forming an adhesive layer over the substrate;
   positioning the substrate proximate to the semiconductor die to contact the bump to the conductive layer and form a bonding interface;
   curing the adhesive layer by heating the semiconductor die and bonding interface to a melting point of the first metal for a time sufficient to melt a portion of the first metal from the conductive layer and to cure the adhesive layer to secure the semiconductor die to the substrate;
   dissolving a portion of the bump by metallurgically reacting the bump and the conductive layer at the melting point of the first metal;
   forming a bonding phase at the bonding interface by mixing a dissolved portion of the bump with a molten portion of the first metal; and
   singulating the semiconductor wafer to separate the semiconductor die after forming the bonding phase.

2. The method of claim 1, wherein the melting point of the first metal is less than a melting point of the second metal.

3. The method of claim 1, further including adhering a surface of the semiconductor die to a surface of the substrate with the adhesive layer that does not contact the bump or the conductive layer.

4. The method of claim 3, further including curing the adhesive layer simultaneously with the heating of the bonding interface and the forming of the bonding phase.

5. The method of claim 1, wherein the first metal includes tin and the second metal includes gold.

6. The method of claim 1, wherein metallurgically reacting the bump and the conductive layer includes increasing a temperature at the bonding interface above the melting point of the first metal.

7. A method of making a semiconductor device, comprising:
   providing a substrate;
   forming a conductive layer including a first metal on the substrate;
   providing a semiconductor die;
   forming a bump including a second metal on the semiconductor die;
   forming an adhesive over the semiconductor die;
   disposing the semiconductor die over the substrate to contact the bump to the conductive layer and form a bonding interface;
   dissolving a portion of the bump by metallurgically reacting the bump and the conductive layer at a melting point of the first metal while simultaneously curing the adhesive to secure the semiconductor die to the substrate; and
   forming a bonding phase at the bonding interface by mixing a dissolved portion of the bump with a molten portion of the first metal.

8. The method of claim 7, further including heating the bonding interface to the melting point of the first metal for a time sufficient to melt a portion of the first metal from the conductive layer.

9. The method of claim 8, wherein the first metal includes tin.

10. The method of claim 9, wherein the second metal includes gold.

11. The method of claim 10, wherein heating the bonding interface to the melting point of the first metal includes heating the bonding interface to a temperature of about 232 degrees Celsius for a duration of 1 to 2 seconds.

12. The method of claim 11, wherein forming the bonding phase includes mixing the tin with the gold to form a 4:1 gold/tin alloy.

13. The method of claim 7, further including providing a semiconductor wafer including the semiconductor die.

14. The method of claim 13, further including disposing the semiconductor die over the substrate while the semiconductor die is disposed on the semiconductor wafer.

15. The method of claim 13, further including singulating the semiconductor wafer to separate the semiconductor die after forming the bonding phase.

\* \* \* \* \*